(12) United States Patent
Gee et al.

(10) Patent No.: US 11,094,754 B2
(45) Date of Patent: Aug. 17, 2021

(54) ORGANIC LIGHT EMITTING DISPLAY DEVICE AND METHOD OF FABRICATING THEREOF

(71) Applicant: LG Display Co., Ltd., Seoul (KR)

(72) Inventors: Hyuk-Chan Gee, Paju-si (KR); Jeong-Gyun Shin, Paju-si (KR); Young-Tae Son, Paju-si (KR); Sang-Bin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/728,187

(22) Filed: Dec. 27, 2019

(65) Prior Publication Data

US 2020/0212133 A1    Jul. 2, 2020

(30) Foreign Application Priority Data

Dec. 31, 2018 (KR) .......... 10-2018-0173599

(51) Int. Cl.

| | | |
|---|---|---|
| *H01L 27/32* | (2006.01) | |
| *H01L 51/00* | (2006.01) | |
| *H01L 51/56* | (2006.01) | |
| *H01L 51/52* | (2006.01) | |

(52) U.S. Cl.
CPC ...... *H01L 27/3223* (2013.01); *H01L 27/3216* (2013.01); *H01L 27/3246* (2013.01); *H01L 51/0007* (2013.01); *H01L 51/0028* (2013.01); *H01L 51/5259* (2013.01); *H01L 51/56* (2013.01); *H01L 2227/323* (2013.01)

(58) Field of Classification Search
CPC ............ H01L 27/3223; H01L 27/3216; H01L 27/3246; H01L 51/0007; H01L 51/0028; H01L 51/56; H01L 51/5259; H01L 2227/323; H01L 27/3218; H01L 27/3244; H01L 51/0003
See application file for complete search history.

(56) References Cited

U.S. PATENT DOCUMENTS

2004/0099882 A1* 5/2004 Hokari ............... H01L 51/0005
257/200

FOREIGN PATENT DOCUMENTS

| KR | 10-2016-0139635 A | 12/2016 |
|---|---|---|
| KR | 10-2017-0080288 A | 7/2017 |

* cited by examiner

*Primary Examiner* — Kyoung Lee
(74) *Attorney, Agent, or Firm* — Birch, Stewart, Kolasch & Birch, LLP

(57) ABSTRACT

An organic light emitting display device and a method of fabricating thereof are discussed. The organic light emitting display device according to an example includes a plurality of first bank layers arranged along a first direction and a second direction on a substrate to define a plurality of pixels; a plurality of second bank layers disposed along the first direction on the first bank layers to divide the columns of pixels having different colors; an organic light emitting layer in each pixel; at least one first pocket pixel unit at both sides of the pixel having the smallest area; and a first dummy organic light emitting layer in the first pocket pixel unit.

30 Claims, 10 Drawing Sheets

ORGANIC LIGHT EMITTING DISPLAY DEVICE AND METHOD OF FABRICATING THEREOF

CROSS-REFERENCE TO RELATED APPLICATION

This application claims priority to and the benefit of Korean Patent Application No. 10-2018-0173599, filed on Dec. 31, 2018 in the Republic of Korea, the disclosure of which is incorporated herein by reference in its entirety into the present application.

BACKGROUND

1. Field of the Invention

The invention is related to a light emitting display device and a method of fabrication thereof, more particularly to the light emitting display device having an organic light emitting layer of which profiles are the same in each pixel.

2. Description of Related Art

Recently, various thin flat panel display devices have been developed to reduce weight and volume of the display device. As one of these flat panel display devices, the organic light emitting display device of which the organic light emitting layer emits the light by itself has advantages such as fast response speed, high luminous efficiency, high luminance, and wide viewing angle.

The organic light emitting layer is made of an organic light emitting material and formed by a thermal evaporation process. However, the thermal evaporation process has the follow problems.

In the thermal evaporation process, a metal mask is disposed on the front surface of the substrate to block non-display region and then evaporate the organic light emitting material to deposit thereof on the substrate. Thus, there are many depositing processes such as a deposition and alignment of the metal mask, evaporation of the organic light emitting material, and a removal of the metal layer to form the organic light emitting layer, so that, the fabricating process is complicated, the fabricating process is delayed, and the fabricating cost is increased.

Further, an aligning device should be used to align correctly the metal mask to avoid the bad organic light emitting layer caused by the mis-alignment of the metal mask. Since the thermal evaporation device is enlarged according to the enlargement of the display device, in addition, the fabricating cost is further increased. Even when the display device becomes larger than a certain size, thermal evaporation becomes practically impossible.

SUMMARY OF THE INVENTION

An object of the invention is to provide an organic light emitting display device and a method of fabricating thereof that can be the fast and large size processes by depositing an organic light emitting layer with a coating process.

Another object of the invention is to provide an organic light emitting display device and a method in which the dry environments of an organic light emitting material coated in pixels having different areas are different for each other, so that the profiles of the organic light emitting layers formed in the pixels of different colors are the same in order to prevent the deterioration of the image quality of the display device.

In order to achieve these objections, the organic light emitting display device comprises a plurality of first bank layers arranged along a first direction and a second direction on a substrate to define a plurality of pixels; a plurality of second bank layers disposed along the first direction on the first bank layers to divide the columns of pixels having different colors; an organic light emitting layer in each pixel; at least one first pocket pixel unit at both sides of the pixel having the smallest area; and a first dummy organic light emitting layer in the first pocket pixel unit.

At least one second pocket pixel unit is disposed at both sides of the pixel having the medium area and a second dummy organic light emitting layer is coated in the second pocket pixel unit.

wherein each of the pixels includes R (Red), G (Green), and B (Blue) pixels, and the relationship of areas (a1,a2,a3) of the R, G, and B pixels is $a3>a2>a1$. R, G, and B-organic light emitting layers are respectively formed in the R, G, and B pixels.

The first dummy organic light emitting layer can be made of the same material as the R-organic light emitting layer and the second dummy organic light emitting layer can be made of the same material as the G-organic light emitting layer.

At least one of the first pocket pixel unit and the second pocket pixel unit can be continuously formed along a first direction or formed in plural arranged at a predetermined interval along a first direction.

At least one of the first pocket pixel unit and the second pocket pixel unit can be a through hole formed in the second bank layer and a concave groove on the upper surface of the second bank layer.

Further, a method of fabricating an organic light emitting display device comprises forming a plurality of first bank layers along a first direction and a second direction on a substrate to define, and a plurality of pixels a plurality of second bank layers along the first direction on the first bank layers to divide the rows of pixels having different colors in each pixel; forming a first pocket pixel unit at both sides of the pixel having the smallest area; forming a first electrode in each pixel; coating an organic light emitting material in each of pixel columns and a first dummy organic light emitting material in the first pocket pixel unit; and drying the organic light emitting material and the first dummy organic light emitting material to form an organic light emitting layer and a dummy organic light emitting layer.

DETAILED DESCRIPTION OF THE EMBODIMENTS

The advantages and the features of the present invention and the method of achieving them will become apparent with reference to the embodiments described in detail below together with the accompanying drawings. The present invention may, however, be embodied in many different forms and should not be limited to the embodiments disclosed below. Rather, these embodiments are provided so that this disclosure of the present invention will be complete, and will fully convey the scope of the invention to those skilled in the art to which the preset invention pertains, and the present invention is merely defined by the scope of claims.

Hereinafter, various embodiments of the invention will be described in detail accompanying drawings.

In the embodiments of this invention, the coating process is used to form the organic light emitting layer of the organic light emitting display device, not used by the thermal evaporation process. In the embodiments of this invention, that is, the organic light emitting material is dropped in the predetermined area and then the dropped organic light emitting material is spread out on the substrate to form the organic light emitting layer. Comparing to the organic light emitting layer formed by the thermal evaporation process, thus, the organic light emitting layer can be simply and rapidly formed. Further, the organic light emitting display device having large size can be fabricated.

In particular, in the embodiments of this invention, the dry environments of the organic light emitting material coated in the R, G, and B pixels having different areas are different for each other to prevent the non-uniformity of the thickness of the organic light emitting layer caused by the difference of the dry speed by the coating thickness of the organic light emitting material between the R, G, and B pixels.

Figure 1:
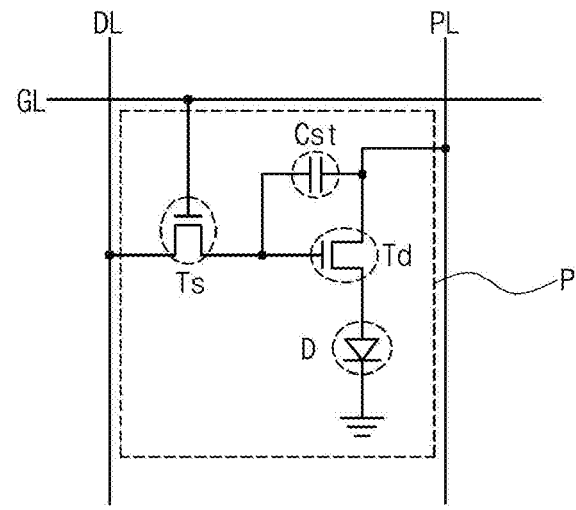
FIG. 1 is a schematic circuit of an organic light emitting display device according to one or more embodiment of the invention.

FIG. 1 is a schematic circuit of an organic light emitting display device according to one or more embodiments of the invention. All the components of the organic light emitting display device according to all embodiments of the invention are operatively coupled and configured.

As shown in FIG. 1, the organic light emitting display device includes a plurality of gate lines GL and data lines DL, which are cross each other to define a plurality of pixels P, and a plurality of power lines PL. In each of the pixels P, a switching thin film transistor Ts, a driving thin film transistor Td, a storage capacitor Cst, and an organic light emitting diode D are disposed.

The switching thin film transistor Ts is connected to the gate line GL and the data line DL. The driving thin film transistor Td and the storage capacitor Cst are disposed between the switching thin film transistor Ts and the power line PL. The organic light emitting diode D is connected to the driving thin film transistor Td.

In this organic light emitting display device, the switching thin film transistor Ts is turned on by the gate signal applied to the gate line GL and then the data signal applied to the data line DL is supplied to the gate electrode of the driving thin film transistor Td and the one electrode of the storage capacitor Cst through the switching thin film transistor Ts.

The driving thin film transistor Td is turned on by the data signal applied to the gate electrode. Thus, the current proportion to the data signal is supplied to the organic light emitting diode D from the power line PL through the driving thin film transistor Td so that the organic light emitting diode D emits the light of luminance proportion to the current through the driving thin film transistor Td.

At this time, the data voltage proportion to the data signal is charged in the storage capacitor Cst, so that the gate voltage of driving thin film transistor Td is uniformly kept during one frame.

Figure 2:
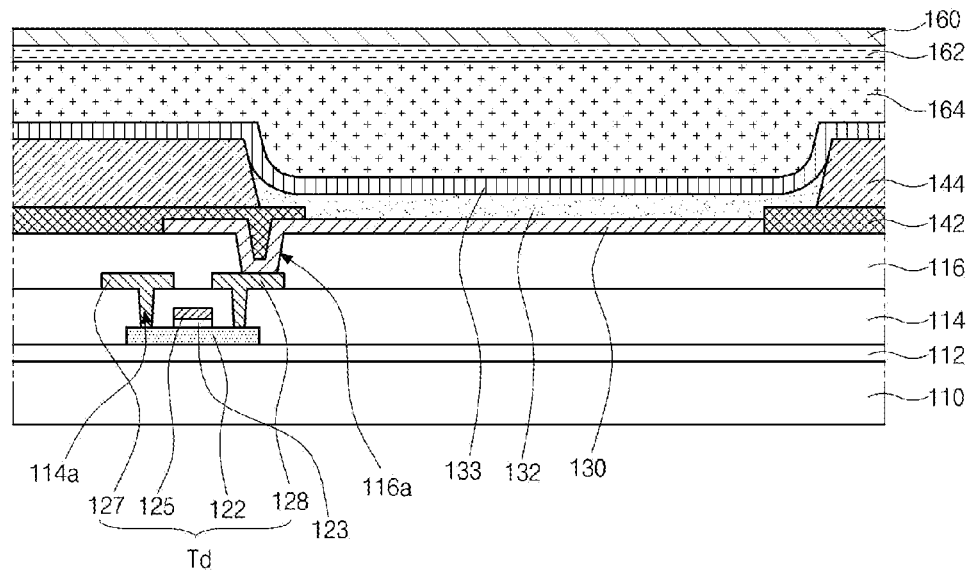
FIG. 2 is a view showing the structure of one pixel of the organic light emitting display device according to one or more embodiments of the invention.

FIG. 2 is a view showing real structure of one pixel of the organic light emitting display device according to an example of the invention.

As shown in FIG. 2, a buffer layer 112 is formed on a first substrate 110 and the driving thin film transistor Td is disposed on the buffer layer 112. The first substrate 110 can be made of a transparent material such as glass. Further, the first substrate 110 can be made of the transparent and flexible plastic such as polyimide. In addition, the buffer layer 112 can be formed of a single layer made of an inorganic material such as SiOx and SiNx, or formed of a plurality of layers made of an inorganic material such as SiOx and SiNx.

The driving thin film transistor Td is disposed in each pixel (e.g., P). The driving thin film transistor Td includes a semiconductor layer 122 on the buffer layer 112, a gate insulating layer 123 formed on at least a part of the semiconductor 122, a gate electrode 125 on the gate insulating layer 123, an interlayer 114 on the whole area of the first substrate 110 to cover the gate electrode 125, and a source electrode 127 and a drain electrode 128 on the interlayer 114 where the source electrode 127 is connected to the semiconductor layer 122 through a first contact hole 114a.

Further, the switching thin film transistor is disposed on the first substrate 110. The switching thin film transistor can have the same structure as the driving thin film transistor.

The semiconductor layer 122 can formed of crystalline silicon or oxide semiconductor such as indium gallium zinc oxide (IGZO). The semiconductor layer 122 includes a channel layer in the center region and a doping layer in both sides of the channel layer. The source electrode 127 and the drain electrode 128 are contacted with the doping layer respectively.

The gate electrode 125 can be formed of a metal such as Cr, Mo, Ta, Cu, Ti, Al or Al alloy. The gate insulating layer 123 and the interlayer 114 can be formed of a single layer made of an inorganic insulating material such as SiOx or SiNx. Further, the gate insulating layer 123 and the interlayer 114 can be formed of double layers including SiOx layer and SiNx layer. The source electrode 127 and the drain electrode 128 can be formed of Cr, Mo, Ta, Cu, Ti, Al, or Al alloy.

Although the driving thin film transistor has a specific structure in the drawings and the above description, the driving thin film transistor of the invention is not limited to the illustrated structure, and any driving thin film transistor of any structure can be applied.

On the driving thin film transistor, a passivation layer 116 is formed. The passivation layer 116 can be formed of the organic material such as a photo-acryl. Further, the passivation layer 116 can be formed of a plurality of layers including inorganic layer and organic layer. A second contact hole 116a is formed in the passivation layer 116.

On the passivation layer 116, a first electrode 130 is formed and connected electrically to the drain electrode 128 of the driving thin film transistor through the second contact hole 116a. The first electrode 130 can be formed of single layer or a plurality of layers made of the metal such as Ca, Ba, Mg, Al, Ag, or an alloy thereof. The first electrode 130 is connected to the drain electrode 128 of the driving thin film transistor to apply an image signal from the outside.

The first bank layer 142 and the second bank layer 144 are formed at the boundary between the pixels P on the passivation layer 116. The first bank layer 142 and the second bank layer 144 which serve as a barrier layer partitions each pixels P to prevent the mixture of the light of different colors from the neighboring pixels. As shown in figure, the first bank layer 142 is formed on the passivation layer 116 and the second bank layer 144 is formed on the first bank layer 142. However, the first bank layer 142 can be on the first electrode 130 and the first electrode 130 can be extended to the side surfaces of the first bank layer 142 and the second bank layer 144.

The organic light emitting layer 132 is formed on the first electrode 130 and the bank layers 142 and 144. Although described in detail later, the organic light emitting layer 132 can be formed by coating and drying the organic light emitting material in a solution state on the first electrode 130, not thermal evaporation process. The organic light emitting layer 132 can be an R-organic light emitting layer formed on R pixel, G-organic light emitting layer formed on G pixel, and a B-organic light emitting layer formed on B pixel to emit respectively red light, green light, and blue light.

Although the organic light emitting layer 132 is formed in only one pixel P in the figure, the organic light emitting layer is substantially formed over a plurality of pixels of same color arranged in the strip form. Thus, the organic light emitting layer 132 is not formed to have a predetermined thickness in the plurality of pixels P and then a variation occurs in thicknesses of the outer region and the center region of the display device. The thickness variation of the organic light emitting layer 132 is caused by coating and drying of the organic light emitting layer 132.

When the coated organic light emitting materials in the solution state is dried, the solvent in the organic light emitting material is removed by evaporation and only the organic light emitting material remains. Since the evaporation rate of the solvent in the outer region of the display device is greater than that in the central region of the display device, the organic light emitting material in the outer region of the display device is dried first. Accordingly, a portion of the organic light emitting material 132 of the un-dried central region is spread to the outer region, so that the thickness deviation between the outer region and the central region of the display device occurs.

The organic light emitting layer 132 can includes light emitting layer, an electron injecting layer and a hole injecting layer for injecting respectively electrons and holes into the light emitting layer, and an electron transporting layer and a hole transporting layer for transporting respectively the injected electrons and holes to the light emitting layer.

A second electrode 133 is formed on the organic light emitting layer 132. The second electrode 133 can be made of transparent conductive material such as Indium Tin Oxide (ITO) and Indium Zinc Oxide (IZO) or the thin metal for passing visual light therethrough. However, the second electrode 133 is not limited these materials.

An encapsulating layer 164 is formed on the second electrode 134. The encapsulating layer 164 can be formed in a single layer of inorganic layer and can be formed in double layers of the inorganic layer and an organic layer. Furthermore, the encapsulating layer 164 can be formed in triple layers of inorganic layer/organic layer/inorganic layer. In this case, the inorganic layer can be made of the inorganic material or mixtures thereof such as SiOx and SiNx, but not limited these materials. The organic layer can be made of the organic materials such as PT (Polyethylene Terephthalate), PEN (Polyethylene Naphthalate), PC (Polycarbonates), PI (Polyimide), PES (Polyethylene Sulfonate), POM (polyoxymethylene), PAR (Polyarylate), but not limited these materials.

An adhesive layer 162 is deposited on the encapsulating layer 164, and a second substrate 160 is disposed on the adhesive layer 162 so that the second substrate 160 is attached to the display device. As the adhesive layer, any material can be used as long as it has good adhesion and heat resistance and water resistance. A thermosetting resin such as an epoxy compound, an acrylate compound, or an acrylic rubber can be used as the adhesive layer 162. Further, a photocurable resin can be used as the adhesive layer 162. In this case, the adhesive layer 162 is cured by irradiating the adhesive layer 162 with light such as ultraviolet rays.

The adhesive layer 162 may not only bond the first substrate 110 and the second substrate 160, but also encapsulate display device to block the moisture thereto. Although the reference number 162 is called as the adhesive layer for convenience, thus, the reference number 162 can be called as encapsulant.

The second substrate 160 is an encapsulation cap for encapsulating the organic light emitting display device. The second substrate 160 can be made of protection film such as a PS (polystyrene) film, PE (polyethylene) film, PEN film, or PI film. Further, the second substrate 160 can made of a glass.

A planarization layer can be disposed between the second electrode 133 and the adhesive layer 162. The planarization layer can be formed in a single organic layer or a plurality of layers of inorganic layer and organic layer. For example, the inorganic layer can be made of SiOx and SiNx and the organic layer can be made of photo-acryl. However, the planarization layer is not limited these materials.

The first electrode 130, the organic light emitting layer 132, and the second electrode 133 form an organic light emitting diode. The first electrode 130 is a cathode of the organic light emitting diode and the second electrode 133 is an anode of the organic light emitting diode. When voltage is applied to the first electrode 130 and the second electrode 133, the electrons are injected into the organic light emitting layer 132 from the first electrode 130, and the holes are injected into the organic light emitting layer 132 from the second electrode 133. By the electrons and the holes, excitons are generated in the organic light emitting layer 132. As these excitons decay, light corresponding to the energy difference between Low Unoccupied Molecular Orbital (LUMO) and Highest Occupied Molecular Orbital (HOMO) of the light emitting layer is generated and emitted to the outside of the second substrate 160.

Further, the first electrode 130 is made of a transparent conductive material such as ITO or IZO or a metal having a thin thickness through which visible light is transmitted, and the second electrode 133 is formed in single layer or a plurality of layers made of metal such as Ca, Ba, Mg, Al, Ag, or the like. The light generated in the organic light emitting layer 132 can be emitted to the outside of the first substrate 110.

In the organic light emitting display device of the present invention, not only the organic light emitting diode having the above structure but also fundamental structure of various organic light emitting diode currently known can be applied.

In this organic light emitting display device, each of the pixel P is divided by the bank layer and the organic light emitting diode having R, G, and B-organic light emitting layers are in each pixel.

In this invention, the bank layer is formed in the double layers of the first bank layer 142 and the second bank layer 144 thereon. In this invention, in particular, the first bank layer 142 is made of hydrophilic material and the second bank layer 144 is made of hydrophobic material. At that time, the width of the first bank layer 142 is larger than that of second bank layer 144, so that the first bank layer 142 is exposed through both sides of the second bank layer 144 and the organic light emitting layer 132 is disposed on the first electrode 130 and the exposed area of the first bank layer 142.

Alternatively, the width of the first bank layer 142 is identical with the width of the second bank layer 144 to align the first bank layer 142 and the second bank layer. The organic light emitting layer 132 is formed on only the first electrode 130.

As described above, the bank layers includes the hydrophilic first bank layer 142 and the hydrophobic second bank layer 144 to form rapidly the organic light emitting layer 132 and fabricate the organic light emitting display device of large area. Hereinafter, this reason will be described in more detail.

Figure 3:
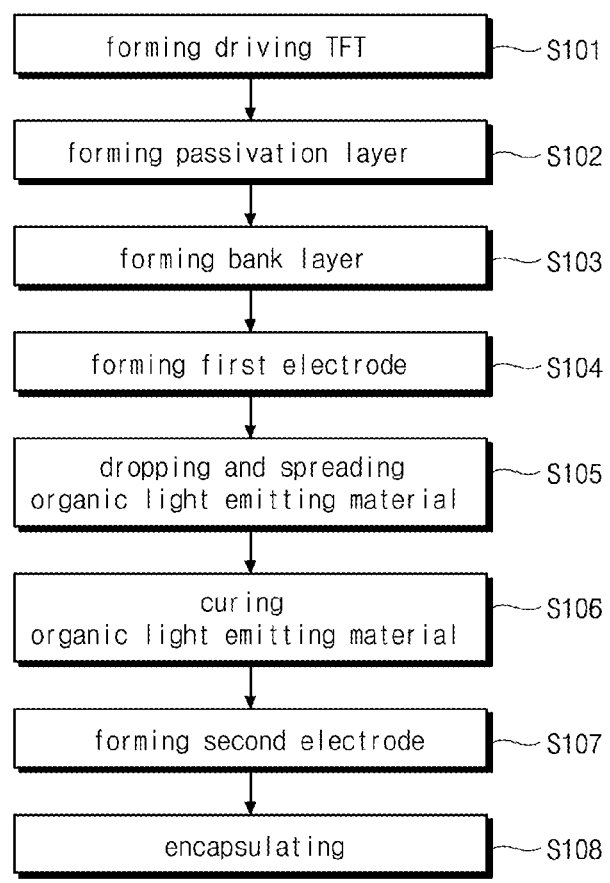
FIG. 3 is a flow chart showing a fabrication process of the organic light emitting display device according to an embodiment of the invention.

FIG. 3 is a flow chart showing a fabrication process of the organic light emitting display device according to one embodiment of the invention and a method of fabricating the organic light emitting display device according to an example of the invention will be described accompanying this drawing.

As shown in FIG. 3, the buffer layer 112 is first formed on the first substrate and then the driving thin film transistor including the semiconductor layer 122, the gate insulating layer 123, the gate electrode 125, the interlayer 114, the source electrode 127, and the drain electrode 128 is formed on the buffer layer 112 (S101).

Thereafter, the organic material such as photo-acryl is deposited over the whole area of the first substrate 110 having the driving thin film transistor to form the passivation layer 116 (S102) and then the first and second bank layers 142 and 144 formed on the passivation layer (S103).

In this case, the first bank layer 142 is disposed along the circumference of the all the pixels P of the organic light emitting display device to divide all the pixels from the other pixels. The second bank layer 144 partitions the pixels P of same color from the pixels P of different colors.

In other word, the first bank layers 142 are arranged in the matrix form along the traverse and longitudinal directions to define a plurality of pixels and the second bank layers 144 are arranged along the longitudinal direction to define a plurality of pixel columns of same color.

Subsequently, the first electrode 130 is formed in each pixel (S104) and then the organic emitting material is deposited (dropped and spread) and cured to form the organic light emitting layer 132 (S105, S106). Since the first electrode 130 is formed in unit of the first bank layer 142, that is, pixel unit, the first electrode 130 is separated between the neighboring pixels. Since the organic light emitting layer 132 is formed in unit of the second bank layer 144, that is, unit of pixel column, the organic light emitting layer 132 continuously formed in a plurality of pixels P arranged in longitudinal direction.

Thereafter, the second electrode 133 is formed on the organic light emitting layer 132 and then encapsulated to complete the organic light emitting display device (S107, S108).

Figure 4:
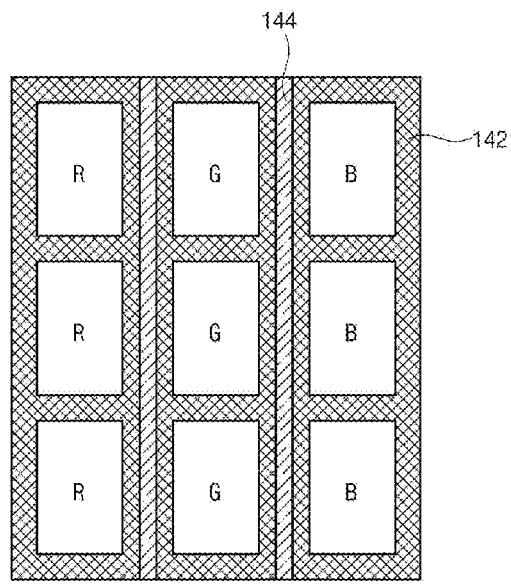
FIG. 4 is a plan view showing schematically a first bank layer and a second bank layer of an example of the invention.

FIG. 4 is a plan view showing schematically the first bank layer 142 and the second bank layer 144 of the organic light emitting display device according to the above process of the invention.

As shown in FIG. 4, a plurality of R, G, B pixels are respectively disposed in the organic light emitting display device and the R, G, B organic light emitting layers are respectively disposed in each R, G, B pixels. Each of the R, G, B pixels are respectively arranged in strip form and then the R, G, B pixels are repeatedly disposed in the transverse direction or the longitudinal direction.

As shown in FIG. 4, a plurality of R, G, B pixels are respectively disposed in the organic light emitting display device and the R, G, B organic light emitting layers are respectively disposed in each R, G, B pixels. Each of the R, G, B pixels are respectively arranged in strip form and then the R, G, B pixels are repeatedly disposed in the transverse direction or the longitudinal direction.

The second bank layer 144 is disposed between the R, G, B pixels which are arranged in the longitudinal direction. Since one pixel column includes a plurality of pixels of same color which are arranged in the longitudinal direction in strip form, the pixel columns of different colors are divided by the second bank layer 144. The second bank layer 144 is formed on the first bank layer 142 with a width smaller than that of the first bank layer 142.

In the organic light emitting display device according to the invention, as described above, the organic light emitting layer 133 is formed by depositing the organic light emitting material in the region partitioned by the first bank layers 142 and the second bank layers 144 and then drying (or hardening) the deposited organic light emitting material, the coating method of the organic light emitting material will be described with FIG. 5.

Figure 5:
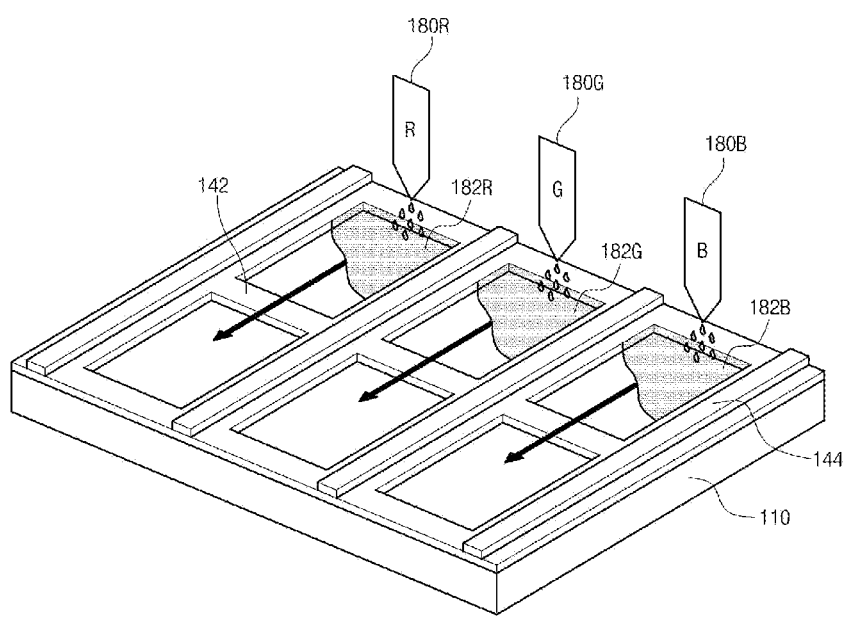
FIG. 5 is a view showing a coating process of the organic light emitting material of the organic light emitting display device according to an example of the invention.

FIG. 5 is a view showing the coating process of the organic light emitting material of the organic light emitting display device according to the one embodiment of the invention. In the figure, only the first bank layer 142 and the second bank layer 144 are shown on the first substrate 110 for convenience of description, and other components such as a thin film transistor are omitted.

As shown in FIG. 5, a plurality of R, G, and B pixels formed on the first substrate 110. A plurality of pixels of same color are arranged in the strip form in the first direction (for example, the longitudinal direction) and the plurality of pixels of different colors are alternatively arranged in the second direction (for example, RGBRGB in the traverse direction).

The first bank layer 142 is formed along the first and second directions of the first substrate 110 so that the first bank layer 142 is disposed along the circumference of the all the R, G, and B pixels. The second bank layer 144 is formed along the first direction on the first bank layer 142 and thus the second bank layer 144 is disposed between the pixels of different colors, for example, between the R pixel column and the G pixel column, between the G pixel column and the B pixel column, and between the B pixel column and the R pixel column.

After the first and second bank layers 142 and 144 are formed, a dispensing device having a first dispenser 180R, a second dispenser 180G, and a third dispenser 180B containing respectively R-organic light emitting material 182R, G-organic light emitting material 182G, and B-organic light emitting material 182B is provided over at least one position of each of R-pixel column, G-pixel column, and B-pixel column defined by the second bank layer 144. Then, the organic light emitting material 182R, 182G, and 182B of predetermined amount is dropped at each of pixel columns.

Each of the first to third dispensers 180R, 180G, and 180B includes a nozzle for opening and closing at the predetermined period to dispense the organic light emitting material 182R, 182G, and 182B of desired amount on the first substrate 110. At this time, the nozzle of the dispensers 180R, 180G, and 180B can be opened for a relatively short time and small amounts of the organic light emitting materials 182R, 182G, and 182B are dropped several times. Further, desired amount of the organic light emitting materials 182R, 182G, and 182B can be dropped once.

As shown, the first to third dispenser 180S, 180G, and 180B are respectively disposed in each pixel column so that the organic light emitting materials 182R, 182G, and 182B are dropped in only one position of the corresponding pixel. Further, a plurality of first to third dispensers 180R, 180G, and 180B can be disposed in each pixel column and then the organic light emitting materials 182R, 182G, and 182B can be dropped in a plurality of positions of each corresponding pixel columns. In addition, the first to third dispenser 180R, 180G, and 180B can move to drop the organic light emitting materials 182R, 182G, and 182B at a plurality of positions of each pixel column.

As described above, by dropping the organic light emitting material at a plurality of positions of one pixel column, the organic light emitting layer can be quickly formed even in a large area organic light emitting display device.

Meanwhile, in one or more examples of the invention, various devices such as a slit coater having slit for discharging the organic light emitting material 182S, 182G, and 182B and a drop coater for dropping the organic light emitting material 182R, 182G, and 182B of predetermined amount can be used as the dispensing device.

The organic light emitting material 182R, 182G, and 182B dropped in the pixel column is spreading along the pixel column arranged in the first direction. In this case, the first bank layer 142 and the second bank layer 144 are disposed between the pixels of different colors in the first direction. Further, only the first bank layer 142 is disposed between a plurality of pixels in pixel column arranged along the first direction. Thus, the dropped organic light emitting materials 182R, 182G, and 182B are not spread in the second direction by the first bank layer 142 and the second bank layer 144 thereon, and flow only in the first direction over the first bank layer 142, so that the organic light emitting materials 182R, 182G, and 182B are uniformly coated over the entire area of each of the corresponding R, G, and B pixel columns.

The organic light emitting layer can be formed by applying the heat to organic light emitting materials 182R, 182G, and 182B to remove the solvent therefrom.

As described above, in one or more examples of the invention, the organic light emitting layer is formed by coating process rather than thermal deposition process. In particular, in the invention, the first bank layer 142 is formed along the second direction, and the double bank layers of the first bank layer 142 and the second bank layer 142 are formed along the first direction (pixel column direction) between pixels of different colors. Therefore, the organic light emitting materials 182R, 182G, and 182B are coated to the plurality of pixels disposed in each of the R, G, and B pixel columns at the same time, so that the organic light emitting materials 182R, 182G, and 182B can be rapidly coated.

When the bank layer is made of a single layer, all the pixels are made of bank layers of the same height and all the pixels are separated from adjacent pixels by a single bank layer. Therefore, in order to form the organic light emitting layer 132 by the dropping method, the organic light emitting materials 182R, 182G, and 182B should be dropped independently of each pixel. In other words, dropping must be performed a number of times corresponding to the number of pixels. On the other hand, in the invention, since the organic light emitting materials 182S, 182G, and 182B are respectively coated to a plurality of pixels arranged in corresponding pixel columns arranged along the first direction by one drop, the organic light emitting layer 132 can be rapidly formed comparing to the structure having the single bank layer.

On the other hand, in this invention, the organic light emitting layers formed in the R, G, and B pixels can be formed to have the same profile by canceling the difference in the drying environment of the organic light emitting material caused by the area difference between the pixels of different colors, This will be described in more detail with reference to the accompanying drawings.

Figure 6:
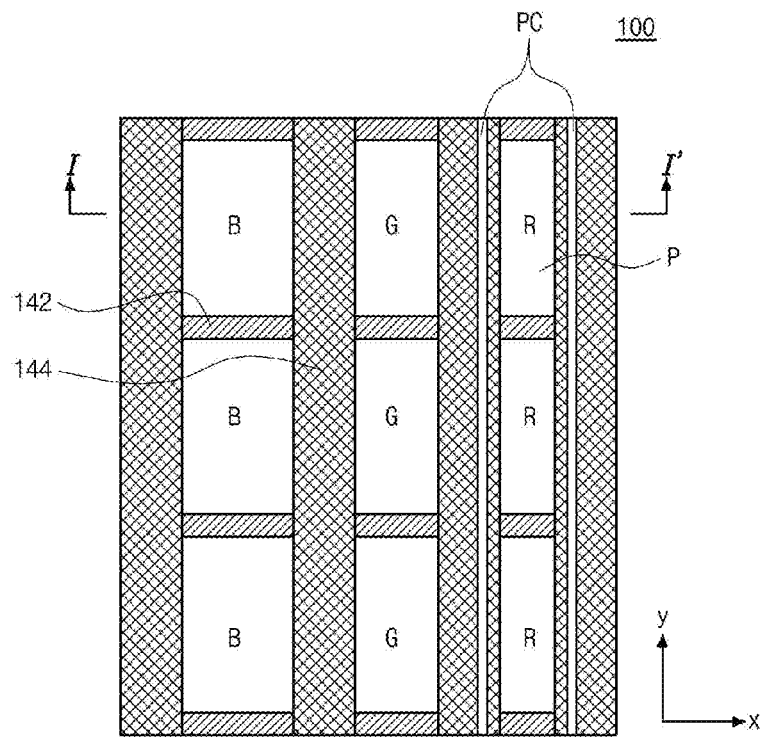
FIG. 6 is a plan view showing schematically the organic light emitting display device according to a first embodiment of the invention

FIG. 6 is the plan view schematically the structure of the organic light emitting display device according to the first embodiment of the invention. Only three R, G, and B pixels are arranged along the x-direction in the organic light emitting display device, but these R, G, and B pixels are repeated along the x-direction in the practical organic light emitting display device or other variations are possible.

As shown in FIG. 6, the organic light emitting display device 100 according to the first embodiment of the invention includes a plurality of R, G, B pixels which is arranged in a strip form along the longitudinal direction, i.e., y-direction.

In this case, only the first bank layer 142 is disposed at the region between adjacent pixels in the pixel column in which a plurality of the pixels of same color are arranged in the longitudinal direction, but the second bank layer 144 is not disposed at this region. Thus, the organic light emitting layer is continuously in the whole area of each pixel column. Furthermore, the second bank layer 144 is disposed between the adjacent pixels of different colors, so that the organic light emitting material is not mixed into the pixel of different color.

The areas of the R, G, B pixels, i.e., the luminescent area, are different for each other. In this case, the luminescent area of the B pixel is the largest, the luminescent area of the G pixel is medium, and the luminescent area of the R pixel is the smallest. For example, the luminescent area of the R, G, and B pixels can be in a ratio of 1:1.5:2, but is not limited thereto.

In this embodiment, as described above, the luminescent area a1 of the B pixel, the luminance area a2 of the G pixel, and the luminescent area a3 of the R pixel are set in different size in consideration of luminance and light efficiency for each color.

In order to emit the light similar to natural light, the luminance and light efficiency of light emitted from the R, G, and B pixels should be uniform. However, since the organic light emitting diodes have different luminance and the light efficiency for each color, the image quality of the organic light emitting display is degraded when the luminance regions of the pixels are formed in the same size.

The luminance and the light efficiency are lowered in order of the R-organic light emitting diode, the G-organic light emitting diode, and the B-organic light emitting diode. In the invention, it is possible to cancel the low luminance and the light efficiency by increasing the luminance area of the pixel of the color with low luminance and light efficiency relatively, thereby the deterioration caused by the low luminance and light efficiency can be prevented.

For example, the luminescent area of the B pixel is the largest, the luminescent area of the G pixel is medium, and the luminescent area of the R pixel is the smallest, so that the light has a uniform brightness and light efficiency as a whole and thus light close to natural light is emitted as much as possible.

In addition, since the luminescent area of the B organic light emitting diode having shortest life is relatively larger than other light emitting diode to obtain the desired luminance under relatively low driving voltage, the life of the B-organic light emitting device can be made almost equal to the life of the R-organic light emitting device.

At both sides of the R pixel column, pocket pixel units PC having predetermined width can be formed in the extension direction of the R pixel column. The plurality of R pixels are formed in the R pixel column arranged in the strip form along the longitudinal direction and the pocket pixel units PC are continuously extended along the longitudinal direction.

As will be described later in detail, the drying environment of an organic light emitting material coated in the R pixel having a relatively small area can be the same as that in the B and the G pixels by the pocket pixel unit PC, so that the organic light emitting layer profile of the R pixel can be the same as that of the B and the G pixels.

Figure 7:
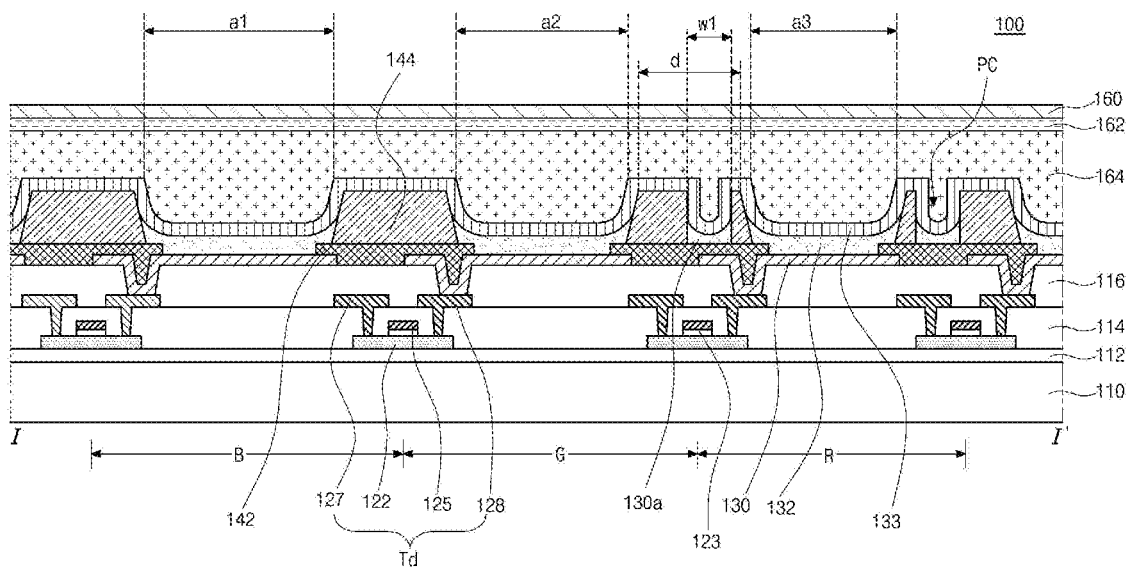
FIG. 7 is a sectional view along line I-I' of FIG. 6.

FIG. 7 is a sectional view along line I-I' of FIG. 6 showing deposition of the organic light emitting material. The structure of the organic light emitting display device according to this embodiment is similar with that of FIG. 2 except for the second bank layer 144 and thus the same structure will be omitted or briefly described, and only the other structure will be described in detail.

As shown in FIG. 7, R, G, B pixels of different colors is formed on the substrate in the different area. In this case, the luminescent area a1 of B pixel is the largest, the luminescent area a2 of G pixel is medium, and the luminescent area a3 of R pixel is the smallest (a1>a2>a3). For example, For example, the luminescent areas of the R, G, and B pixels can be in a ratio of 1:1.5:2, but is not limited thereto.

The driving TFT is disposed in each pixel and the passivation layer 116 is formed over the driving TFT. The first electrode 130 is formed in each of the R, G, B pixels on the passivation layer 116. The first bank layer 142 and the second bank layer 144 are disposed between the pixels of different colors. In this case, the width of the first bank layer 142 is larger than that of second bank layer 144 so that a part of the first bank layer 142 is exposed where the second bank layer 144 is disposed on the first bank layer 142.

The organic light emitting layers 132 including R-organic light emitting material, G-organic light emitting material, and B-organic light emitting material are respectively formed in the responding R, G, B pixels. When the organic light emitting material is respectively coated in the R, G, and B pixels, thus, the organic light emitting material is coated over the first substrate 110 (that is, on the first electrode) and the exposed area of the first bank layer 142. Accordingly, the luminescent area a1, a2, and a3 caused by the organic light emitting layer 132 are dependent upon the second bank layer 144.

Furthermore, the pocket pixel units PC are disposed at the both sides of the R pixel and dummy organic light emitting layers are respectively formed in the pocket pixel units PC. The dummy organic light emitting layer 130a is formed with R-organic light emitting material.

When the organic light emitting layer 132 is formed, the luminescent area of the R, G, B pixels is proportional to amount of the organic light emitting material coated in the corresponding R, G, B pixels, so that the B-organic light emitting material 182B is coated the largest, the G-organic light emitting material 182G is coated in medium, and the R-organic light emitting material 182R is coated the smallest.

The R-organic light emitting material 182R, G-organic light emitting material 182G, and B-organic light emitting material 182B coated in different areas and amounts can volatilize a solvent contained therein by a drying process by application of heat to form the organic light emitting layer. At this time, since the R-organic light emitting material 182R, G-organic light emitting material 182G, and B-organic light emitting material 182B are dried under the same dry environment such as same dry temperature and same dry time, the R-organic light emitting material 182R, G-organic light emitting material 182G, and B-organic light emitting material 182B should all be dried with same dry speed, assuming the dry environment is the same.

However, since the coating area and the coating amount of the R, G, B-organic light emitting materials 182R, 182G, and 182B is different for each other, the amount of the solvent evaporating (or volatilizing) from the R, G, B-organic light emitting materials 182R, 182G, and 182B is also different for each other. The R, G, B-organic light emitting materials 1828, 182G, and 182B can be formed in the solution state in which a phosphor, a fluorescent material, a dopant, etc. are melted in the solvent. The R, G, B-organic light emitting materials 182R, 182G, and 182B in solution state are respectively dropped at the corresponding R, G, B pixel columns and then spreading in the whole area thereof. In this case, when the coated R, G, B-organic light emitting materials 182R, 182G, and 182B are dried, there is the evaporated (or volatilized) solvent above the R, G, B-organic light emitting materials 182R, 182G, and 182B.

Accordingly, since the amount of solvent evaporated from the R, G, B-organic light emitting materials 182R, 182G, and 182B varies depending on the coating area and the coating amount of the R, G, B-organic light emitting materials 182R, 182G, and 182B, the solvent concentration of the atmosphere above the R, G, and B pixels also varies.

Since the luminescent area a1 and the coating amount of the organic light emitting material 182B are the largest, the solvent concentration of the atmosphere above the B pixel is the highest. Further, since the luminescent area a3 and the coating amount of the organic light emitting material 182R are the smallest, the solvent concentration of the atmosphere above the R pixel is the lowest. Thus, when the organic light emitting materials 182R, 182G, and 182B are dried under the same dry environment, the dry speed of the R-organic light emitting material 182R is the highest and the dry speed of the B-organic light emitting material 182B is the lowest.

The difference of the dry speed of the R, G, and B organic light emitting materials 182R, 182G, and 182B causes the difference of the profile of the R, G, B organic light emitting layers at the end of drying.

Figure 8A:
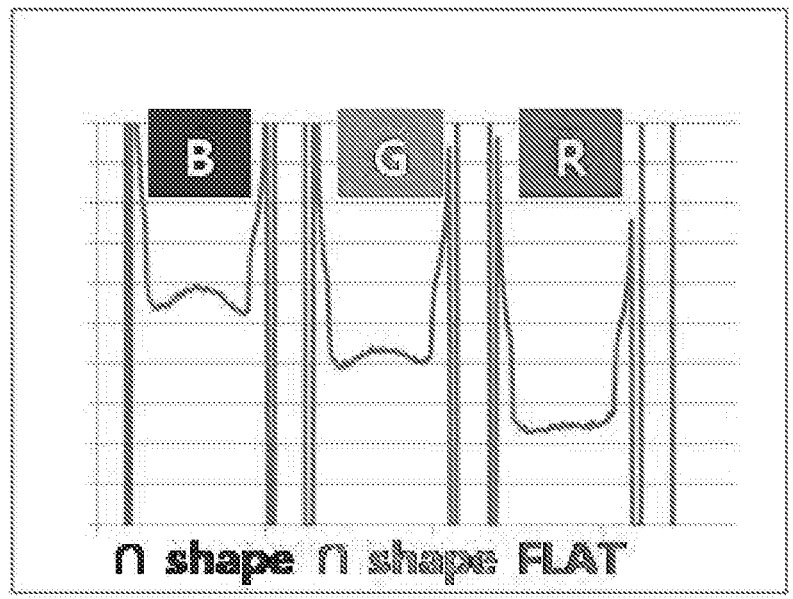
FIGS. 8A and 8B are views showing respectively a profile of an organic light emitting layer of the organic light emitting display device which pocket pixel unit is not formed and the organic light emitting display device according to an example of the invention.

FIG. 8A is a view showing the profile of the organic light emitting layers in the R, G, and B pixels having the different luminescent areas.

As shown in FIG. 8A, the organic light emitting layers in the B pixel and the G pixel are formed in ∩ shape (or can be formed in Ushape in accordance with the structure of the organic light emitting display device) in which the thickness of the organic light emitting layers are different at the central region and the outer region in the pixel. On the contrary, the organic light emitting layers in the R pixel is formed in the flat shape in which the thickness of the organic light emitting layers are substantially same at the central region and the outer region in the pixel. Therefore, the profiles of the organic light emitting layers in the B pixel and the G pixel are different from profile of the organic light emitting layer in the R pixel.

These profile differences of the organic light emitting layer between the R, G, and B pixels causes the difference in the luminance and contrast ratio between the lights emitted from the G, B pixels and R pixel. By this difference in the luminance and contrast ratio, the image quality is deteriorated.

Although one of the most ideal shapes of the organic light emitting layer can be preferably a flat structure having no thickness difference in the outer region and the center region of the pixel, the deterioration of the image quality due to the shape difference of the profile of the organic light emitting layer for each pixel in the whole area is more severe than the deterioration of the image quality due to the minute thickness difference in one pixel.

Since the deterioration of the image quality due to the thickness difference of the organic light emitting layer in one pixel is the same for all the pixels, the deterioration of the image quality can be prevented by compensating equally image signals supplied to all the pixels. On the contrary, in order to compensate for the deterioration of the image quality due to the difference in the profile of the organic light emitting layer for each pixel, the different compensation must be performed for each color. Therefore, the circuit structure for compensation becomes complicated.

In addition, in even case where the organic light emitting layers in the B pixel and the G pixel is formed in uniform thickness by improving the formation mechanism of the entire R, G, B-organic light emitting materials 182R, 182G, and 182B, the thickness variation can occur in the R-organic light emitting layer, which is formed to have a uniform thickness, by the change of formation mechanism. Accordingly, the organic light emitting layers in all the R, G, and B pixels should be formed in the same profile to form the organic light emitting layers of all the R, G, B pixels in the flat shape having a uniform thickness by changing the formation mechanism of the R, G, and B-organic light emitting materials 182R, 182G, and 182B.

On the other hand, the R, G, B-organic light emitting layers are formed to have different thicknesses so as to adjust the light efficiency of each of the R, G, B-organic light emitting layers to improve the light efficiency of the overall organic light emitting display device. In the drawing, the thickness of the B-organic light emitting layer is the largest, the thickness of the G-organic light emitting layer is medium, and the thickness of the R-organic light emitting layer is formed the smallest. According to the structure of the organic light emitting display device such as a cavity structure, etc., the thickness of the R-organic light emitting layer can be the largest, the thickness of the G-organic light emitting layer can be medium, and the thickness of the B-organic light emitting layer can be the smallest. On the other hand, the thickness of the R, G, and B-organic light emitting layers can be variously set as necessary.

Thus, one of the factors (e.g., one of the most important factors) to improve the image quality in the organic light emitting display device by varying the shape of the R, G, and B-organic light emitting layers is to equalize the profiles of the organic light emitting layers between the R, G, and B pixels. That is, the profiles of the organic light emitting layers between the R, G, and B pixels are equalized and then the organic light emitting layers within all the pixels can be formed flat by varying the formation mechanism of the organic light emitting layers, thereby controlling the thickness of the R, G, and B-organic light emitting layers as necessary.

In one or more examples of this invention, the profiles of the organic light emitting layers between the R, G, and B pixels can be made same by the pocket pixel units PC along the both sides of the R pixel columns. A shown in figure, the pocket pixel units PC are filled with the dummy organic light emitting material and the dummy organic light emitting material is also dried when the R, G, and B organic light emitting materials 182R, 182G, and 182B are dried. Thus, the drying environment of the R pixel can be similar with that of the B pixel or G pixel by the pocket pixel units PC and the dummy organic light emitting material therein.

On the other word, the dummy organic light emitting material 183R coated around the R-organic light emitting material is also dried when the R, G, and B-organic light emitting materials 182R, 182G, and 182B are dried. Thus, the solvent evaporates not only in the R-organic light emitting material 182R but also in the dummy organic light emitting material (183R), so that the solvent concentration above the R pixel can be similar to the solvent concentration above the B pixel or the G pixel. As a result, the dry speed of the R-organic light emitting material 182R can be almost similar to the dry speed of the B-organic light emitting material 182B or the G-organic light emitting material 182G.

By the same dry environment, therefore, the profiles of the R, G, and B organic light emitting layers can be formed almost similarly throughout the whole area of the organic light emitting display device, so that the deterioration of the image quality of the organic light emitting display device can be prevented.

Figure 8B:
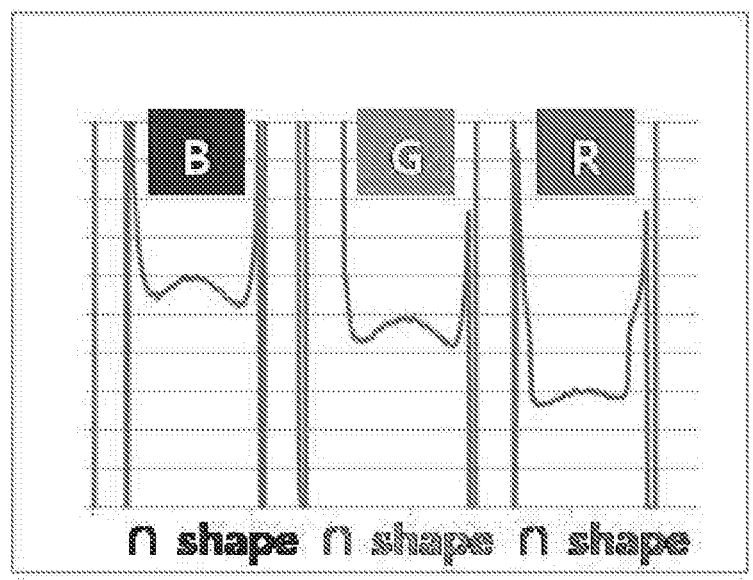

FIG. 8B is a view showing the profiles of the organic light emitting layers formed in each of the R, G, and B pixels having different luminescent area in the organic light emitting display device according to this invention.

As shown in FIG. 8B, in the organic light emitting display device according to this invention, the organic light emitting layers are not formed in the same thickness in the R, G, and B pixels, but the organic light emitting layers are formed in the same profile in all the R, G, and B pixels. Therefore, the optical characteristics of the organic light emitting layers of all the pixels in the organic light emitting display device are the same, thereby preventing deterioration of the image of the organic light emitting display device.

Further, since the profiles of the organic light emitting layers in the pixels are all the same, the organic layer is formed in the flat structure within the pixel and the flatness is all the same in all the pixels. In addition, the organic light emitting layer formed on the R, G, and B pixels can be formed with the same profile and thickness by controlling the structure of the pocket pixel unit PC according to the structure of the organic light emitting display device.

Referring back to FIG. 7, the pocket pixel unit PC can be formed in the various widths w1. The amount of the dummy organic light emitting material coated in the pocket pixel unit PC is dependent upon the width w1 of the pocket pixel unit PC. Further, the dry environment above the R pixel is determined by the coating amount of the dummy organic light emitting material and the dry speed of the R-organic light emitting material 182R is determined by the dry environment above the R pixel.

Thus, the width w1 of the pocket pixel unit PC is determined depending on whether the dry environment above the R pixel is the same as the dry environment above the B pixel or the dry environment above the G pixel. For example, the pocket pixel unit PC is formed to have the relatively wide width w1 when the dry environment of the upper part of the R pixel is the same as that of the upper part of the B pixel and the pocket pixel unit PC is formed to have the relatively narrow width w1 when the dry environment of the upper part of the R pixel is the same as that of the upper part of the G pixel. In addition, the width w1 of the pocket pixel unit PC can be determined according to the area ratio of the R, G, and B pixels.

The interval between the R pixel and the pocket pixel unit PC is determined depending on whether the dry environment above the R pixel is the same as the dry environment above the B pixel or the dry environment above the G pixel. For example, the interval between the R pixel and the pocket pixel unit PC is relatively increased when the dry environment of the upper part of the R pixel is the same as that of the upper part of the B pixel and the interval between the R pixel and the pocket pixel unit PC is relatively decreased when the dry environment of the upper part of the R pixel is the same as that of the upper part of the G pixel. In addition, the interval between the R pixel and the pocket pixel unit PC can be determined according to the area ratio of the R, G, and B pixels.

However, since the pocket pixel units PC are formed to control the dry speed of the R-organic light emitting material coated in the R pixel, the pocket pixel units PC should be located closer to the R-pixel than to the adjacent G or B pixels. On other word, when the interval between the R pixel and the G pixel and the interval between the R pixel and the B pixel is d, the pocket pixel unit PC should be formed within a distance d/2 from the R pixel.

On the other hand, the dummy organic light emitting material identical to the R-organic light emitting material 182S is coated to the pocket pixel unit PC, so that the solvent evaporates (or volatilizes) at the same speed from the pocket pixel unit PC and the R pixel to easily control the concentration of the solvent upper portion of the pocket pixel unit PC and the R pixel.

However, in one or more example of this invention the dummy organic light emitting material can be formed different material from the R-organic light emitting material 182R. Since the same organic light emitting material is coated to the pocket pixel unit PC and the R pixel to evaporate the solvent contained in the organic light emitting material to evaporate under the same dry environment, the dummy material different from the organic light emitting material can be coated in the pocket pixel unit PC if the solvent concentration of the dummy material coated to the pocket pixel unit PC and the solvent concentration of the R-organic light emitting material 182R are the same.

Further, the dummy organic light emitting material can be composed only of the solvent included in the R-organic light emitting material 182R. In this case, the concentration of the dummy organic light emitting material, that is, the concentration of solvent of the dummy organic light emitting material, can be controlled to equal the evaporation speed of the solvent of the dummy organic light emitting material to the evaporation speed of the solvent of the R-organic light emitting material 182R.

It is assumed that the dummy organic light emitting material of the pocket pixel unit PC can be composed of the same material as the B-organic light emitting material 182B or the G-organic light emitting material 182G. However, since the interval between the pocket pixel portion PC and the R pixel is much smaller than the interval between the B pixel and the G pixel of other colors adjacent to the R pixel, the B-organic light emitting material 182B or the G-organic light emitting material 182G can be contained within the R pixel when the B-organic light emitting material 182B or the G-organic light emitting material 182G is coated in the pocket pixel unit PC. Accordingly, it is improper to coat the B-organic light emitting material 182B or the G-organic light emitting material 182G in the pocket pixel unit PC.

Figure 9:
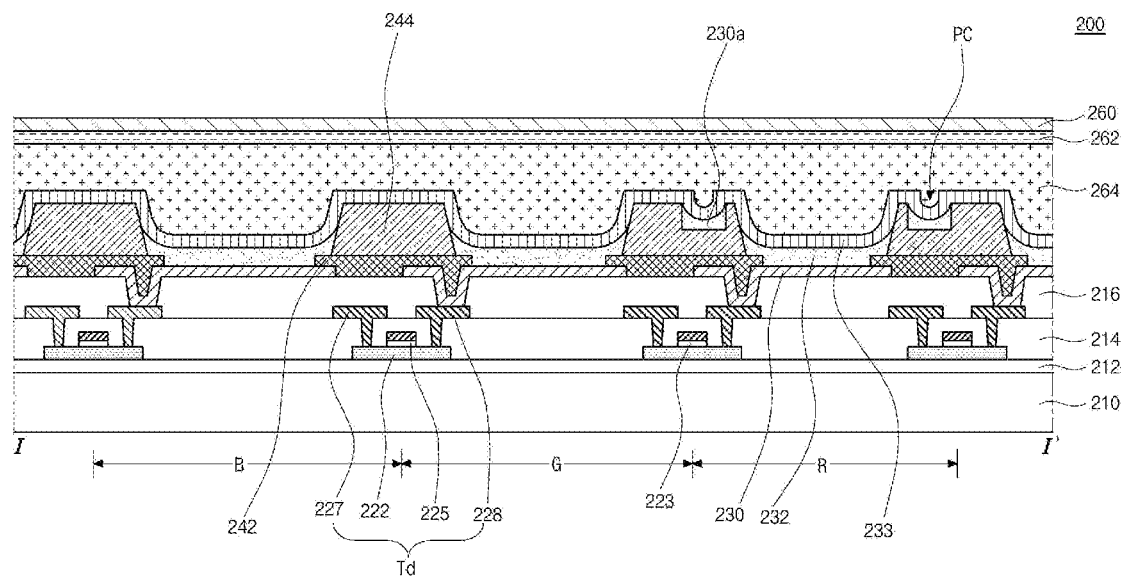
FIG. 9 is a sectional view showing schematically the organic light emitting display device according to a second embodiment of the invention.

FIG. 9 is a view showing structure of the organic light emitting display device according to a second embodiment of the invention. The same structure as that of the first embodiment will be omitted or simplified and only the other components will be described in detail.

As shown in FIG. 9, in the organic light emitting display device 200 according to this embodiment, the R, G, and B pixels are defined by the first bank layer 242 and the second bank layer 244 thereon, and the pocket pixel units PC are formed in the second bank layer 244 at both sides of the R pixel having the smallest luminescent area.

Whereas the pocket pixel unit PC is formed in the shape of a through hole penetrating of the second bank layer 144 in the first embodiment shown in FIG. 7, the pocket pixel unit PC is formed in a concave groove shape on the upper surface of the second bank layer 144 in this embodiment shown in FIG. 9.

In this embodiment, the organic light emitting layers 232 having R-organic light emitting material, G-organic light emitting material, and B-organic light emitting material are formed in each R, G, and B pixels and the dummy organic light emitting layer 230a is formed in the pocket pixel unit PC. Thus, the dry environment of the R-organic light emitting material in the R pixel having the smallest luminescent area can be the same as the dry environment of the G-organic light emitting material or B-organic light emitting material so that the profiles of the organic light emitting layers formed in the R, G, and B pixels can be the same.

The dummy organic light emitting material of the dummy organic light emitting layer 230a can be the same as the R-organic light emitting material 282R, can be another solution including a solvent having the same concentration, and can be composed of only a solvent having a controlled concentration.

Figure 10A:
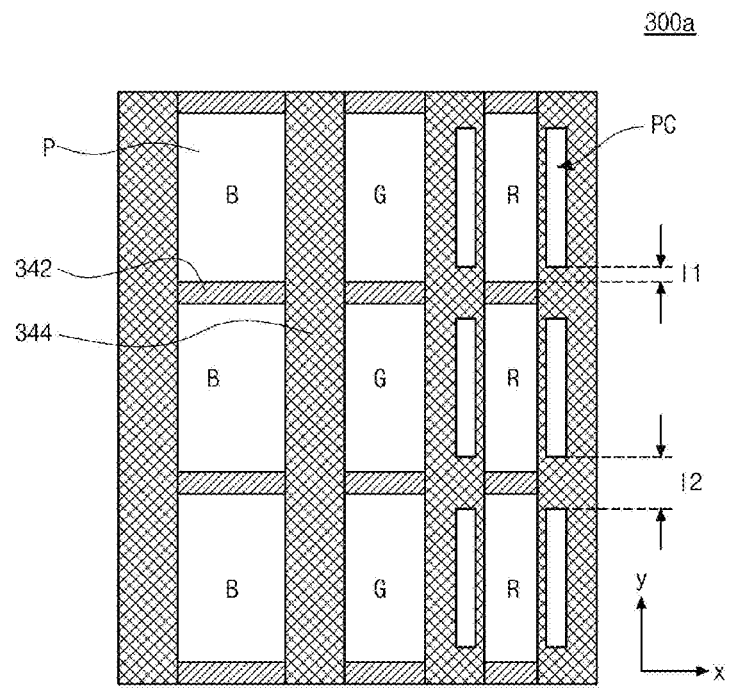
FIGS. 10A to 10C are plan views showing schematically the organic light emitting display device according to a third embodiment of the invention.
Figure 10B:
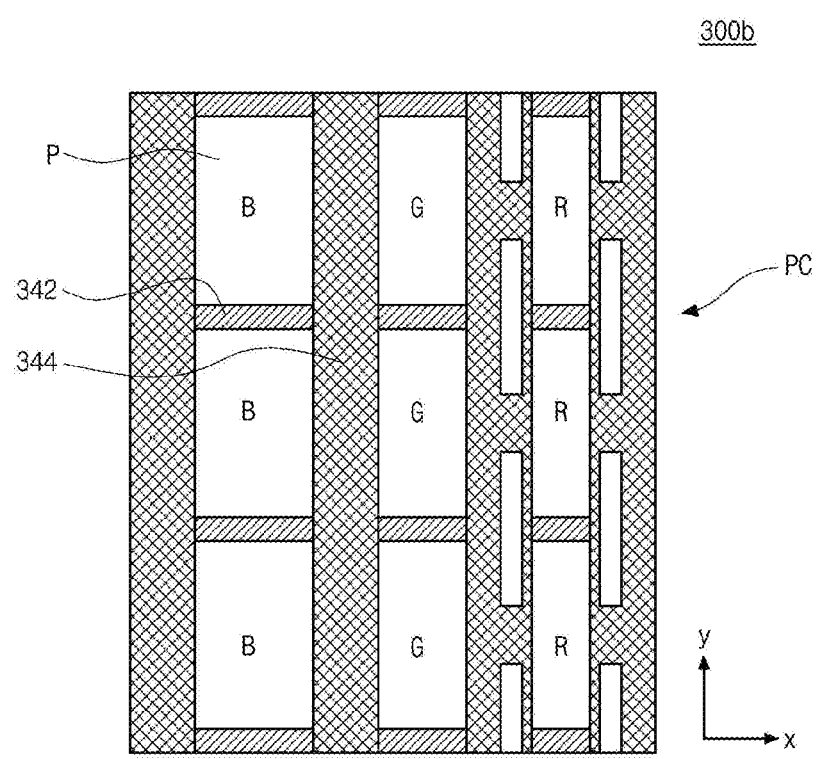
Figure 10C:
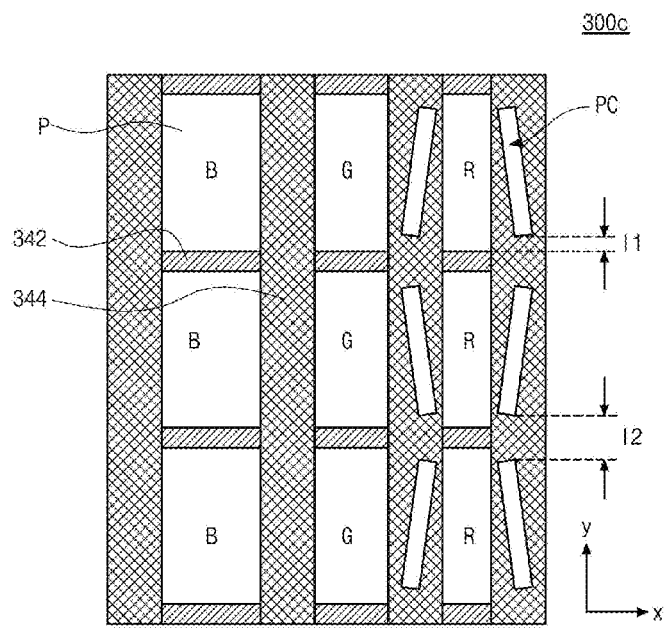

FIG. 10A to FIG. 10C are schematic plan views of the organic light emitting display devices 300a, 300b, and 300c according to the third embodiment of the invention, respectively. The same structure as that of the first embodiment will be omitted or simplified and only the other components will be described in detail.

As shown in FIG. 10A to FIG. 10C, the R, G, and B pixels defined by the first bank layer 342 and the second bank layer 344 have the different areas and arranged in the stripe form along the longitudinal direction (y-direction) in the organic light emitting display device 300a, 300b, and 300c of this embodiment. In this case, the area of the B pixel is the largest and the area of the R pixel is smallest. Each of the R, G, and B pixels is coated with an organic light emitting material and then dried to form an organic light emitting layer.

At the left and right sides of the R pixel having the smallest area, a plurality of pocket pixel units PC are disposed along the longitudinal direction of the R pixel column. In the organic light emitting display device of the first embodiment, as shown in FIG. 6, one pocket pixel unit PC is continuously formed in a strip shape on the left and right sides of the R pixel column. On the contrary, in the organic light emitting display device 300a, 300b, and 300c of this embodiment, a plurality of the pocket pixel units PC are discretely formed at the predetermined interval on both the left and right sides of the R pixel column, but not formed continuously.

The pocket pixel unit PC can be formed as the through hole penetrating the upper and lower surfaces of the second bank layer 344 as shown in FIG. 7, or can be formed as the concave groove shape formed at a predetermined depth from the upper surface of the second bank layer 344 as shown in FIG. 9.

The dummy organic light emitting material is coated in the pocket pixel unit PC. In this case, the dummy organic light emitting material can be an R-organic light emitting material coated in the R pixel, or can be another material having the same solvent concentration as the R-organic light emitting material. In addition, the dummy organic light emitting material can be composed of the same solvent as the R-organic light emitting material.

As shown in FIG. 10A, the length of the pocket pixel unit PC is equal to the length of the R pixel. Thus, the pocket pixel unit PC is disposed at only the both sides of the R pixel, not disposed at the side of the first bank layer 342 between the adjacent R pixels in the longitudinal direction.

As described above, since the pocket pixel unit PC is disposed at only the both sides of the R pixel, the dry environment of the R pixel can be same as those of the B pixel and the G pixel by the dummy organic light emitting material coated in the pocket pixel unit PC.

As shown in FIG. 10B, the pocket pixel unit PC can be formed to be overlapped with two adjacent R pixels along the longitudinal direction. In this case, the pocket pixel unit PC is disposed at the both sides of the first bank layer between the adjacent R pixels along the longitudinal direction. In other word, the pocket pixel unit PC is arranged with a part of two adjacent R pixels and the first bank layer therebetween.

In this structure, the dry environment of the R pixel can be same as those of the B pixel and the G pixel by the dummy organic light emitting material coated in the pocket pixel unit PC and thus the profile of the organic light emitting layer in the R pixel can be same as those of the B pixel and the G pixel.

As shown in FIG. 10C, a plurality of the pocket pixel units PC are discretely disposed at the predetermined interval at the both sides of the R pixel along the y-direction. The pocket pixel units PC are obliquely disposed in the predetermined angel, not parallel to the y direction. In this case, the adjacent pocket pixel units PC along the y-direction are arranged obliquely in opposite directions and thus the pocket pixel units PC are totally disposed in the zigzag shape along the y-direction.

The obliquely arranged pocket pixel unit PC can have a length substantially equal to the length of the R pixel. Further, as shown in FIG. 10A, the pocket pixel unit PC is disposed at only the both sides of the R pixel, not disposed at the side of the first bank layer 342 between the adjacent R pixels in the longitudinal direction. In addition, obliquely arranged pocket pixel unit PC can be disposed at the both sides of the R pixel and the first bank layer between the adjacent R pixels along the y-direction.

In this structure, the dry environment of the R pixel can be same as those of the B pixel and the G pixel by the dummy organic light emitting material coated in the pocket pixel unit PC and thus the profile of the organic light emitting layer in the R pixel can be same as those of the B pixel and the G pixel.

As described above, in this embodiment, one pocket pixel unit PC is not continuously formed at the both sides of the R pixel having the smallest luminescent area along the longitudinal direction, but a plurality of the pocket pixel units PC spaced at the predetermined intervals are disposed along the longitudinal direction of the R pixel column. Accordingly, the dry environment of the R pixel can be the same as those of the B pixel and the G pixel and thus the profile of the organic light emitting layer in the R pixel can be same as those of the B pixel and the G pixel.

In this case, a plurality of the pocket pixel units PC can be arranged parallel to the R pixel at only the both sides of the R pixel as shown in FIG. 10A and a plurality of the pocket pixel units PC can be arranged at the both sides of a part of the R pixel and the first bank layer 342 between the adjacent R pixels along the longitudinal direction as shown in FIG. 10B. Furthermore, as shown in FIG. 10C, a plurality of the pocket pixel units PC can be arranged in zigzag shape at both sides of the R pixel in alignment with the R pixels and a plurality of the pocket pixel units PC can be arranged in zigzag shape at both sides of a part of the R pixel and the first bank layer 342 between the adjacent R pixels along the longitudinal direction.

According to this embodiment, the same effects can be obtained in the three organic light emitting display devices 300a, 300b, and 300c, that is, the effect of improving the drying environment of the R pixel, so that the profile of the organic light emitting layer in the R pixel can be same as those of the B pixel and the G pixel.

Therefore, in this embodiment, if the pocket pixel portions PC disposed on both sides of the R pixel can be formed at the predetermined intervals, the pocket pixel portions PC can be arranged in the various arrangement shapes.

Figure 11:
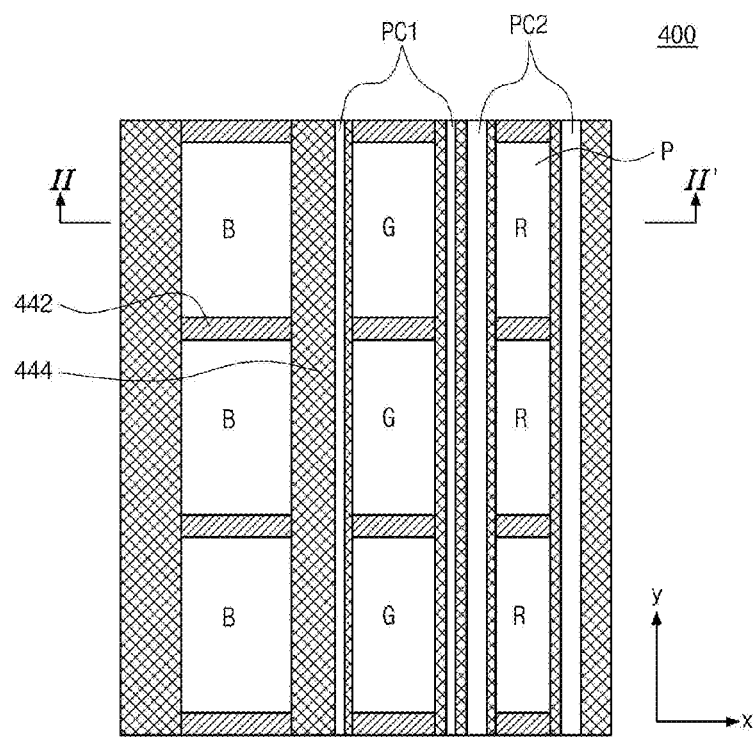
FIG. 11 is a plan views showing schematically the organic light emitting display device according to a fourth embodiment of the invention.
Figure 12:
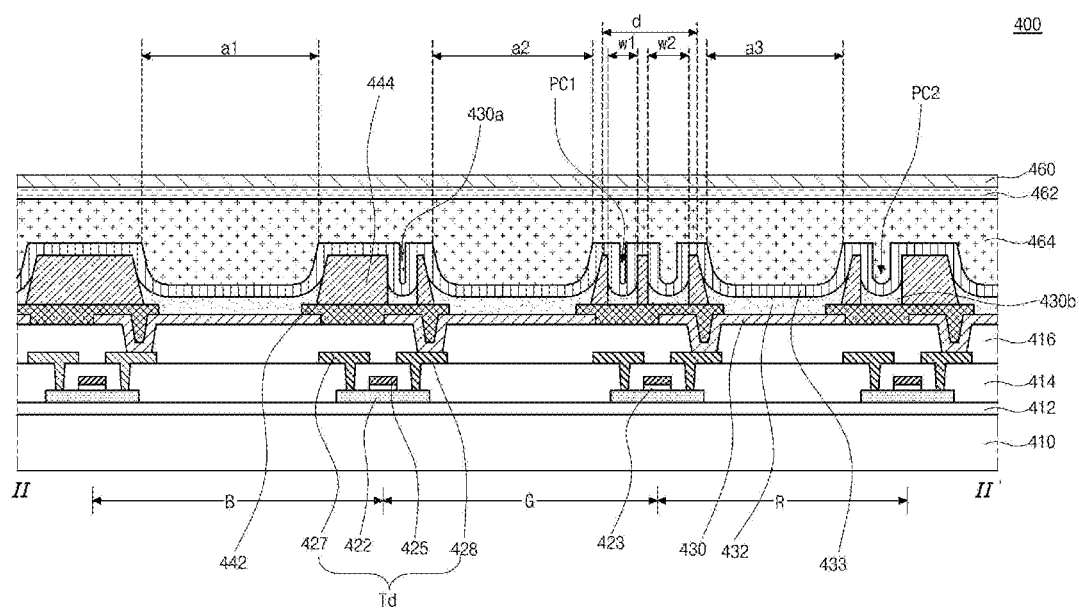
FIG. 12 is a sectional view along line II-II' of FIG. 11.

FIG. 11 is a schematic plan view of the organic light emitting display devices 400 according to the fourth embodiment of the invention and the FIG. 12 is a sectional view along the line II-II' of FIG. 11. The same structure as that of the first embodiment will be omitted or simplified and only the other components will be described in detail.

As shown in FIGS. 11 and 12, in the organic light emitting display device 400 of this embodiment, the pocket pixel unit is formed not only in both sides of the R pixel having the smallest area but also in both sides of the G pixel having the medium area.

In this embodiment, a first pocket units PC1 are disposed in the second bank layer 444 in the both sides of the G pixel and a second pocket units PC2 are disposed in the second bank layer 444 in the both sides of the R pixel to equalize the dry environment of the B pixel having the largest area to the dry environment of other pixels. In this case, the width w2 of the second pocket pixel unit PC2 is larger the width w1 of the first pocket pixel unit PC1 (that is, w2>w1), so that the amount of the solvent evaporating from the second pocket pixel unit PC2 is larger than that from the first pocket pixel unit PC1. The dummy G-organic light emitting layer 430a is formed in the first pocket pixel unit PC1 and the dummy R-organic light emitting layer 430b is formed in the second pocket pixel unit PC2

The G-dummy organic light emitting material can be the same material as the organic light emitting layer 432 of the G pixel and can be composed of the material containing the same solvent as the G-organic light emitting material. Further, the G-dummy organic light emitting material can be composed of the solvent containing in the G-organic light emitting material.

The R-dummy organic light emitting material can be the same material as the organic light emitting layer 432 of the R pixel and can be composed of the material containing the same solvent as the R-organic light emitting material. Further, the R-dummy organic light emitting material can be composed of the solvent containing in the R-organic light emitting material.

As described above, in this embodiment, the first pocket pixel units PC1 having the relatively small width are disposed at the both sides of the G pixel and the second pocket pixel units PC2 having relatively large width are disposed at the both sides of the R pixel, so that the dry environment of the R pixel and the G pixel can be same as that of the B pixel when drying the organic light emitting material and thus the profile of the organic light emitting layer in the R, G, B pixels are exactly the same.

In the organic light emitting display device 400 according to this embodiment, the first pocket pixel units PC1 and the second pocket pixel units PC2 can be continuously disposed at the both sides of the G pixel and the R pixel along the pixel column, respectively, and a plurality of first pocket pixel units PC1 and the second pocket pixel units PC2 are disposed at the both sides of the G pixel and the R pixel at the predetermined interval, respectively. The first pocket pixel units PC1 and the second pocket pixel units PC2 can be formed as the through hole penetrating the upper and lower surfaces of the second bank layer 444 and can be formed as the concave groove shape formed at a predetermined depth from the upper surface of the second bank layer 444.

In addition, the shapes of the first pocket pixel units PC1 and the second pocket pixel units PC2 can be different. For example, one of the first pocket pixel units PC1 and the second pocket pixel units PC2 can be continuously formed along the longitudinal direction and the other can be formed in plural numbers spaced apart from each other by the predetermined interval. One of the first pocket pixel units PC1 and the second pocket pixel units PC2 can be formed as the through hole penetrating the upper and lower surfaces of the second bank layer 444 and the other can be formed as the concave groove of the second bank layer 444.

Many details are set forth in the foregoing description but should be construed as illustrative of preferred embodiments rather than to limit the scope of the invention. Therefore, the invention should not be defined by the described embodiments, but should be defined by the claims and their equivalents.

What is claimed is:

1. An organic light emitting display device, comprising:
    a plurality of first bank layers arranged along a first direction and a second direction on a substrate to define a plurality of pixels;
    a plurality of second bank layers disposed along the first direction on the first bank layers to divide columns of the plurality of pixels having different colors;
    an organic light emitting layer in each pixel of the plurality of pixels;
    at least one first pocket pixel unit at sides of a smallest pixel having a smallest area among the plurality of pixels; and
    a first dummy organic light emitting layer in the first pocket pixel unit.

2. The organic light emitting display device of claim 1, further comprising:
    at least one second pocket pixel unit at sides of a medium pixel having a medium area among the plurality of pixels; and
    a second dummy organic light emitting layer in the second pocket pixel unit.

3. The organic light emitting display device of claim 2, wherein the plurality of pixels include R (red), G (green), and B (blue) pixels, and a relationship of first, second and third areas a1,a2,a3) of the R, G, and B pixels is a3>a2>a1.

4. The organic light emitting display device of claim 3, wherein the R, G, and B pixels include respectively R, G, and B-organic light emitting layers.

5. The organic light emitting display device of claim 4, wherein the first dummy organic light emitting layer is made of a same material as the R-organic light emitting layer.

6. The organic light emitting display device of claim 4, wherein the second dummy organic it emitting layer is made of a same material as the G-organic light emitting layer.

7. The organic light emitting display device of claim 2, wherein at least one of the first pocket pixel unit and the second pocket pixel unit is continuously formed along the first direction.

8. The organic light emitting display device of claim 2, wherein at least one of the first pocket pixel unit and the second pocket pixel unit is formed in plural arranged at a predetermined interval along the first direction.

9. The organic light emitting display device of claim 8, wherein a length of the first pocket pixel unit or the second pocket pixel unit is same as a length of the smallest pixel, and
    the first pocket pixel unit or the second pocket pixel unit is aligned with the smallest pixel.

10. The organic light emitting display device of claim 8, wherein a length of the first pocket pixel unit or the second pocket pixel unit is same as a length of the smallest pixel, and
    the first pocket pixel unit or the second pocket pixel unit is aligned with a part of the smallest pixel and the first bank layer in a region between the smallest pixel and another smallest pixel among the plurality of pixels also having the smallest area.

11. The organic light emitting display device of claim 8, wherein the first pocket pixel unit or the second pocket pixel unit is formed in a zigzag shape.

12. The organic light emitting display device of claim 2, wherein at least one of the first pocket pixel unit and the second pocket pixel unit is a through hole formed in the second bank layer.

13. The organic light emitting display device of claim 2, wherein at least one of the first pocket pixel unit and the second pocket pixel unit is a concave groove on an upper surface of the second bank layer.

14. The organic light emitting display device of claim 1, wherein the first bank layer is made of a hydrophilic material and the second bank layer is made of a hydrophobic material.

15. The organic light emitting display device of claim 1, further comprising a first electrode formed in each of the plurality of pixels,
wherein a width of the first bank layer is larger than a width of the second bank layer, and the first bank layer is exposed through both sides of the second bank layer and the organic light emitting layer is disposed on the first electrode and an exposed area of the first bank layer.

16. The organic light emitting display device of claim 1, further comprising a first electrode formed in of the plurality of pixels,
wherein a width of the first bank layer is identical with a width of the second bank layer to align the first bank layer and the second bank layer, and the organic light emitting layer is formed on only the first electrode.

17. The organic light emitting display device of claim 1, wherein each column of the plurality of pixels includes a plurality of pixels with same color.

18. A method of fabricating an organic light emitting display device, the method comprising:
forming a plurality of first bank layers along a first direction and a second direction on a substrate to define a plurality of pixels, and a plurality of second bank layers along the first direction on the first bank layers to divide rows of the plurality of pixels having different colors;
forming a first pocket pixel unit at sides of a smallest pixel having a smallest area among the plurality of pixels;
forming a first electrode in each of the plurality of pixels;
coating an organic light emitting material in each of the rows of the plurality of pixels and a first dummy organic light emitting material in the first pocket pixel unit; and
drying the organic light emitting material and the first dummy organic light emitting material to form an organic light emitting layer and a dummy organic light emitting layer.

19. The method of claim 18, wherein the plurality of pixels include R (red), G (green), and B (glue) pixels, and a relationship of first, second and third areas (a1,a2,a3) of the R, G, and B pixels is a3>a2>a1.

20. The method of claim 19, wherein the coating the organic light emitting material and the first dummy organic light emitting material includes coating respectively R, G, B organic light emitting materials in a corresponding pixel of the rows of the plurality of pixels.

21. The method of claim 20, wherein the first dummy organic light emitting material is the R-organic light emitting material.

22. The method of claim 20, wherein the first dummy organic light emitting material is made of a material containing a solvent having a same concentration as that of the R-organic light emitting material.

23. The method of claim 20, wherein the first dummy organic light emitting material is made of a solvent of the R-organic light emitting material.

24. The method of claim 20, further comprising:
forming at least one second pocket pixel unit at the both sides of the G pixel; and
coating a second dummy organic light emitting material in the second pocket pixel unit.

25. The method of claim 24, wherein the second dummy organic light emitting material is the G-organic light emitting material.

26. The method of claim 24, wherein the second dummy organic light emitting material is made of material containing a solvent having the same concentration as that of the G-organic light emitting material.

27. The method of claim 24, wherein the second dummy organic light emitting material is made of a solvent of the G-organic light emitting material.

28. The method of claim 18, wherein a width of the first bank layer is larger than a width of the second bank layer, and the first bank layer is exposed through both sides of the second bank layer and the organic light emitting layer is disposed on the first electrode and an exposed area of the first bank layer.

29. The method of claim 18, wherein a width of the first bank layer is identical with a width of the second bank layer to align the first bank layer and the second bank layer, and the organic light emitting layer is formed on only the first electrode.

30. The method of claim 18, wherein each of the rows of the plurality of pixels includes a plurality of pixels with same color.

* * * * *